US007361705B2

(12) United States Patent
Kawaguchi et al.

(10) Patent No.: US 7,361,705 B2
(45) Date of Patent: Apr. 22, 2008

(54) RESIN COMPOSITION AND FLEXIBLE PRINTED CIRCUIT BOARD

(75) Inventors: Akiyoshi Kawaguchi, Tokushima (JP); Yoshiaki Ishii, Tokushima (JP); Hideyuki Tsutsumi, Tokushima (JP); Tomohiro Tanaka, Tokushima (JP)

(73) Assignee: Otsuka Chemical Co., Ltd., Osaka (JP)

( * ) Notice: Subject to any disclaimer, the term of this patent is extended or adjusted under 35 U.S.C. 154(b) by 0 days.

(21) Appl. No.: 10/148,276

(22) PCT Filed: Nov. 29, 2000

(86) PCT No.: PCT/JP00/08414

§ 371 (c)(1),
(2), (4) Date: May 29, 2002

(87) PCT Pub. No.: WO01/40380

PCT Pub. Date: Jun. 7, 2001

(65) Prior Publication Data

US 2003/0078333 A1    Apr. 24, 2003

(30) Foreign Application Priority Data

Nov. 30, 1999 (JP) ................................. 11-341246
Nov. 30, 1999 (JP) ................................. 11-341247

(51) Int. Cl.
*C08K 3/34*    (2006.01)
(52) U.S. Cl. ..................... 524/442; 524/430; 524/445; 524/447; 524/449; 524/451
(58) Field of Classification Search ............... 174/250, 174/256; 257/702; 428/556; 524/437, 442, 524/443, 444, 445, 447, 449, 451, 430
See application file for complete search history.

(56) References Cited

U.S. PATENT DOCUMENTS 5,368,921 A * 11/1994 Ishii et al. .................. 442/232

FOREIGN PATENT DOCUMENTS

EP    0660336    6/1995

OTHER PUBLICATIONS

Patent Abstracts of Japan vol. 1996, No. 06, Jun. 28, 1996 & JP 08 041247 A (Otsuka Chem Co Ltd), Feb. 13, 1996.
Patent Abstracts of Japan vol. 014, No. 363 (C-0746), Aug. 7, 1990 & JP 02 133440 A (Matsushita Electric Works Ltd), May 22, 1990.
Patent Abstracts of Japan vol. 018, No. 043 (C-1156), Jan. 24, 1994 & JP 05 270815 A (Topy Ind Ltd), Oct. 19, 1993.
JP 10-226751 A, and English Abstract thereof, dated Aug. 25, 1998.
JP 09-208822 A, and English Abstract thereof, dated Aug. 12, 1997.
JP 09-124836 A, and English Abstract thereof, dated May 13, 1997.

* cited by examiner

*Primary Examiner*—Edward J. Cain
(74) *Attorney, Agent, or Firm*—Townsend & Banta

(57) ABSTRACT

A resin composition characterized as containing (A) a synthetic resin having a melting temperature of 300° C. or above and (B) a platy inorganic filler incorporated in the resin and having the following properties;
  pH of aqueous dispersion: 5.5-8.0,
  amount of extracted alkalis: Na 30 ppm or below and K 40 ppm or below,
  maximum diameter a: 50 μm or below,
  thickness b: 1.0 μm or below, and
  aspect ratio (a/b): 20 or above.

13 Claims, No Drawings

RESIN COMPOSITION AND FLEXIBLE PRINTED CIRCUIT BOARD

TECHNICAL FIELD

The present invention relates to a resin composition and a flexible printed circuit board. More particularly, the present invention relates to a resin composition which is excellent in mechanical strength and heat resistance, low in linear expansion coefficient and anisotropy, and little susceptible to deterioration, and also to a flexible printed circuit board using the same.

BACKGROUND ART

Synthetic resins having melting temperatures of 300° C. and above exhibit good heat resistance, mechanical strength, mechanical rigidity, chemical resistance, flame retardance, processability on a molding or extruding machine and the like, and have conventionally achieved wide use for many applications such as in the production of automobile, mechanical, electrical and electronic parts.

However, the recent remarkable advances in technology require these synthetic resins to achieve further property improvements, such as in heat resistance, mechanical strength and rigidity, while maintaining the desirable properties they intrinsically possess.

The loading of fibrous inorganic fillers, such as glass fibers, carbon fibers, wollastonite and potassium titanate fibers, in synthetic resins is known to considerably improve mechanical strength, rigidity, heat resistance and other properties thereof. Resin compositions loaded with such glass fibers or carbon fibers however provide an extremely roughened surface and a poor appearance. Also, resin compositions loaded with wollastonite or potassium titanate fibers are highly anisotropic and in some cases yield variations in linear expansion coefficient, among mechanical properties.

The loading of powder- or flake-like inorganic fillers such as calcium carbonate, mica and talc, while sufficient to lower a mold or die shrinkage factor, a linear expansion coefficient or the like and thus increase the dimensional stability, is insufficient to achieve improvements in mechanical strength and heat resistance. Also, the loading of such inorganic fillers in synthetic resins having melting temperatures of 300° C. and above causes hydrolysis of such synthetic resins, which is considered due to either alkaline contents (e.g., sodium and potassium) liberated from the inorganic fillers, or interlayer water from the inorganic fillers, or weakly acidic or alkaline nature of the inorganic fillers. This is also accompanied by the molecular weight reduction which leads to a drop of molding stability and a loss of desirable properties intrinsic to such synthetic resins, which have been problems.

Synthetic resins having melting temperatures of 300° C. and above are also being used for heat-resistant films for use in flexible printed circuit boards. A polyimide resin is representative of materials useful for such heat-resistant films. However, as the technology continues to push up density and integration levels of circuits, the polyimide resin because of its high hygroscopicity will likely become insufficient to provide circuit reliability, which will be a problem. In addition to be high in price, the polyimide resin film can not be laminated onto a metal foil without the use of an adhesive. These problematically increase a total cost.

The above-described polyimide resin is a thermosetting polyimide resin. The use of a thermoplastic resin, such as a thermoplastic polyimide resin, is now under investigation as a possible alternative. The use of the thermoplastic polyimide resin or other thermoplastic resins enables recycling and reduction of a total cost since they can be laminated onto a metal foil by a film extrusion technique. However, the sole use of the thermoplastic polyimide resin results in the insufficient mechanical strength and heat resistance. Also because the thermoplastic polyimide resin has a high linear expansion coefficient in the range of $4\text{-}5\times10^{-5}$ °$C.^{-1}$, curling inevitably occurs when it is laminated onto a metal foil having a linear expansion coefficient of $1\text{-}2\times10^{-5}$ °$C.^{-1}$, which has been a problem. That is, the film is adhered to the metal foil in the laminating process. In the case where the film differs largely in linear expansion coefficient from the metal foil, a resulting laminate of the film and metal foil when cooled to ambient temperature is curled due to the dimensional difference between the top and bottom.

Attempts have been made to improve mechanical strength, heat resistance or the like of thermoplastic resins such as a thermoplastic polyimide resin or to reduce their linear expansion coefficients by loading inorganic fillers therein. Examples of proposed inorganic fillers include powder-form inorganic fillers such as mica, talc and silica; inorganic fibers such as potassium titanate fibers; and the like.

However, the loading of such inorganic fillers in thermoplastic resins results in the production of rigid, less flexible and thus very brittle films. Another problem is the failure to impart the contemplated linear expansion coefficients to resulting films. Other problems arise when the above-described hydrolysis of resins is caused to take place by the alkali contents liberated from inorganic fillers. That is, the resulting molecular weight reduction of resins lowers desirable properties intrinsic to such resins and results in the difficulty to take a film off.

DISCLOSURE OF THE INVENTION

It is an object of the present invention to provide a resin composition, suitable for use as a heat-resistant film for a flexible printed circuit board, which is superior in mechanical strength and heat resistance, low in coefficient of linear expansion and anisotropy and less susceptible to deterioration, and also provide a flexible printed circuit board.

A resin composition in accordance with a first aspect of the present invention is characterized as containing (A) a synthetic resin having a melting temperature of 300° C. or above and (B) a platy inorganic filler incorporated in the resin and having the following properties;

pH of aqueous dispersion: 5.5-8.0,
amount of extracted alkalis, Na: 30 ppm or below, K: 40 ppm or below,
maximum diameter a: 50 µm or below,
thickness b: 1.0 µm or below, and
aspect ratio (a/b): 20 or above.

The incorporation of the platy inorganic filler having the above-specified properties results in the provision of a resin composition which has reduced mold or die shrinkage factor and linear expansion coefficient, satisfactory dimensional stability, improved heat resistance and mechanical strength, and superior processability on a molding or extruding machine. Also if the above-specified pH of aqueous dispersion and amount of extracted alkalis are satisfied, a synthetic resin becomes less susceptible to deterioration and can maintain its intrinsic desirable properties and sustain the effect obtained via loading of the platy inroganic filler for a very long period of time. In the amount of extracted alkalis, Ca may preferably be 10 ppm or below.

A resin composition in accordance with a second aspect of the present invention is characterized as containing (A) a synthetic resin having a melting temperature of 300° C. or above and (B) a flaky inorganic filler incorporated in the resin and having a pH of aqueous dispersion in the range of 5.5-8.0 and an amount of extracted alkalis, Na: 30 ppm or below and K: 40 ppm or below.

If the above-specified conditions, i.e., pH of aqueous dispersion and amount of extracted alkalis are satisfied, a synthetic resin becomes less susceptible to deterioration and can maintain its intrinsic desirable properties and sustain the effect obtained via loading of the flaky inorganic filler for a very long period of time. In the amount of extracted alkalis, Ca may preferably be 10 ppm or below.

A resin composition in accordance with a third aspect of the present invention is characterized as containing (A) a synthetic resin having a melting temperature of 300° C. or above and (B) a synthetic mica incorporated in the resin and having a maximum diameter a of 20 μm or below, a thickness b of 0.05-1.0 μm and an aspect ratio of 20 or above.

The incorporation of the synthetic mica having the above-specified maximum diameter a, thickness b and aspect ratio results in the provision of a resin composition which is superior in mechanical strength and heat resistance, lower in linear expansion coefficient and anisotropy, less susceptible to deterioration and better processable.

The matters common to plural aspects, among the first, second and third aspects, may be hereinafter referred to as those of the "present invention".

In the present invention, a 1 g sample is metered into a 100 ml beaker, 100 ml of deionized water is introduced into the beaker, the beaker content is stirred by a magnetic stirrer for 10 minutes and then its pH is measured by a pH meter. The measured pH value is given as the pH of aqueous dispersion.

Also, a 1 g sample is dispersed in 100 ml water and the resulting aqueous dispersion is stirred at room temperature for 1 hour and filtered using a No. 5 filter paper to obtain a filtrate for subsequent measurement by atomic absorption spectrometry. The measured amount of alkalis is given as the amount of extracted alkalis.

The maximum diameter, thickness and aspect ratio can be measured by observation using a scanning electron microscope and calculated.

The resin composition of the present invention is useful, for example, for formation into a heat-resistant film for use in a flexible printed circuit board.

A flexible printed circuit board in accordance with the present invention is characterized as incorporating a heat-resistant film obtained by processing the resin composition of the present invention.

Specifically, any platy inorganic substance known in the art, either natural or synthetic, can be used for the platy inorganic filler in the first aspect of the present invention, so long as it has the properties and dimension within the respective ranges as specified above. Examples of such inorganic substances include flaky or sheetlike mica, sericite, illite, talc, kaolinite, montmorillonite, smectite and vermiculite; and platy or sheetlike titanium dioxide, potassium titanate, lithium titanate, boehmite and alumina. Among them, flaky or sheetlike mica, and platy or sheetlike titanium dioxide, potassium titanate, lithium titanate, boehmite, γ-alumina and α-alumina are preferably used.

In the present invention, the term platy is used in a generic sence to encompass sheetlike and flaky substances as well as platy substances.

Flaky or sheetlike mica can be synthesized, for example, by a melting process using internal or external heating, or other processes such as disclosed in Japanese Patent Laid Open No. Hei 5-270815. A specific example of such synthetic mica can be represented by the following general formula:

$$X_n Y_m Z_4 O_{10} F_2 \qquad (1)$$

(where, X indicates $K^+$, $Na^+$, $Li^+$, $Ca^{2+}$, $Ba^{2+}$, $Sr^{2+}$ or $Rb^{2+}$; Y indicates $Mg^{2+}$, $Fe^{2+}$, $Fe^{3+}$, $Ni^{2+}$, $Ti^{2+}$, $Zn^{2+}$, $Cu^{2+}$, $Mn^{2+}$, $Al^{2+}$ or $Co^{2+}$; Z indicates $Al^{3+}$, $Fe^{3+}$, $B^{3+}$, $Si^{4+}$ or $Ge^{4+}$; n denotes a numerical value of ⅓-1; and m denotes a numerical value of 2-3).

Those sold in the market, such as under the product names PDM-9WA and PDM-GUP (products of Topy Industries Ltd.) and MK-100 (product of Corp Chemical Co., Ltd.), can also be used.

Flaky or sheetlike boehmite and alumina can be synthesized, for example, as by a flux process, a melting process, a hydrothermal synthesis process such as disclosed in Japanese Patent Laid Open. No. Hei 9-59018 or a process in which a flaky or sheetlike aluminum-containing compound is subjected to a heat treatment.

The platy inorganic substance, if it fails to fall within the above-specified range in at least one of the above-itemized properties, may be treated by a variety of methods known in the art, such as those described below, to render it applicable for the present invention. For example, the platy inorganic substance may be treated with an inorganic or organic acid, such as hydrochloric acid, sulfuric acid, acetic acid, phosphoric acid or phosphorous acid, to adjust a pH of its aqueous dispersion and/or an amount of alkalis extracted therefrom. More specifically, the platy inorganic substance may be mixed with an acid in a mixer or tumbler and then fully dried. It may alternatively be immersed in an aqueous acid solution. Subsequent to the acid treatment, the platy inorganic acid may be fully washed with water. Another effective method is to calcine it at 600° C.-1,300° C.

The platy inorganic substance may be pulverized in accordance with any pulverizing method known in the art to bring its dimension within the specified range. The platy inorganic substance may be pulverized, for example, by an air impacting mill such as a jet mill, a media agitating mill such as a ball mill or atomizer, a Dry Micros crusher type mill (product of Nara Machinery Co., Ltd.), an impact shearing mill such as a roller mill or atomizer, a nanomizer (product of Yoshida Kikai Kogyo, Co., Ltd.) or the like. The use of the jet mill, media agitating mill and nanomizer is particularly preferred for their ability to achieve pulverization of the platy inorganic substance to a maximum diameter of 10 μm or below.

One or more of the substances selected from the group consisting of flaky titanate compounds, mica, sericite, illite, talc, kaolinite, montmorillonite and vermiculite can be used for the flaky inorganic filler in the second aspect. Specifically, those which fall within the category of flaky inorganic filler, among the platy inorganic fillers listed in the first aspect, can be used.

Also, those which fall within the category of synthetic mica, among the platy inorganic fillers listed in the first aspect, can be used for the synthetic mica in the third aspect.

Although described above to be 50 μm or below, the maximum diameter a (major diameter) of the platy inorganic filler in the first aspect is preferably 20 μm or below, more preferably 8 μm or below. Also, its minor diameter is generally 50 μm or below, preferably in the approximate range of 0.5-50 μm, more preferably in the range of 1-30 μm.

These two different terms, major and minor diameters, are used herein for convenience of disclosure to define the dimension of the inorganic filler. There accordingly is a case where the major diameter is equal or close to the minor diameter. In such a case, the platy inorganic filler of the present invention has a square or equivalent configuration.

The platy inorganic filler may be treated at its surface with a coupling agent or the like. The surface treatement of the platy inorganic filler with the coupling agent or the like further improves its mechanical strength and heat resistance so that a resin becomes less susceptible to deterioration and thus more processable. The coupling agent is not particularly specified. Silane, titanate, aluminate and other generally-known coupling agents can be used. Conventional surface treatment processes, both dry and wet, can be utilized. The wet surface treatment process is particularly preferred. The flaky inorganic filler in the second aspect and the synthetic mica in the third aspect may also be subjected to a surface treatment with a coupling agent or the like.

The platy inorganic filler is preferably loaded in the amount of 5-100 parts by weight, more preferably 10-50 parts by weight, based on 100 parts by weight of a synthetic resin which is the (A) component. The loading of below 5 parts by weight may result in the insufficient mechanical strength and dimensional accuracy. The loading of over 100 parts by weight may reduce the fluidity of the composition or provide a poorer appearance to a resulting product. The above-specified loading can also be applied to the flaky inorganic filler in the second aspect and the synthetic mica in the third aspect.

In the present invention, specific examples of synthetic resins which have melting temperatures of 300° C. and above include polyallyl ether ketone, polyethersulfone, polysulfone, polyether imide, liquid crystal polymer, thermoplastic polyimide, polyallylate, polyether nitrile, polyphenylene sulfide, polyphenylene ether, polyamide-imide and the like. Preferred among them are polyallyl ether ketone, polyether imide, polyallylate, aromatic polysulfone, liquid crystal polymers and thermoplastic polyimide. These synthetic resins may be used alone or in combination, if necessary.

One or more of generally-used additives can be added to the resin composition of the present invention within the range that does not impair the desirable properties thereof. Such additives include, for example, heat stabilizers, lubricants, mold releasers, pigments, dyes, UV absorbers, flame retardants, lubricating agents, fillers, reinforcers and the like. The use of heat stabilizers, among these additives, is preferred. Although any of conventionally-known heat stabilizers can be used, the use of phosphorus acid, hindered phenol, phosphate and the like is particularly suitable.

The resin composition of the present invention can be produced by various methods known in the art. An exemplary production method specifically involves introducing, via a side hopper, a platy inorganic filler, which is the (B) component, and other optional components into a twin-screw mixer or the like in which a synthetic resin, which is the (A) component, is being melt kneaded, thereby achieving mixing thereof. A single-screw extruder, co-kneader, multi-screw extruder or the like can also be utilized to achieve the mixing. This enables us to obtain the resin composition in the pellet form.

The resin composition of the present invention can be readily fabricated into products by various processing methods known in the art, such as extrusion, injection molding and compression molding.

The resin composition of the present invention can serve as a compound useful for fabrication into a component part which constitutes a part or whole of an article in substantially all the fields in which synthetic resins are applicable. It is applicable, for example, to transport machines such as automobiles, vehicles, marines, aircrafts and motorcycles; electrical and electronic devices such as household appliances, AV devices, OA devices and communication devices; various mechanical products; and the like.

The resin composition of the present invention is also suitable for formation into a heat-resistant film for a flexible printed circuit board. A film-forming method is not particularly specified. The resin composition can be formed into any form of a film, either oriented or non-oriented. For the fabrication of the non-oriented film, various methods can be utilized, including, for example, a casting method (T-die method) in which the resin composition is melt kneaded in an extruder and extruded from a T-die into a film and then the film cast on a surface of a casting roll is cooled; a tubular method in which the resin composition is extruded from a ring die into a tube which is subsequently cooled with air or water; and the like.

For the fabrication of the oriented film, a method can be utilized in which the non-oriented film fabricated by the casting or tubular method is drawn either monoaxially or biaxially at a drawing temperature of 50-180° C. and optionally heat set at a temperature below a melting point thereof.

In the case where the resin used is a crystalline resin such as polyallyl ether ketone, liquid crystal polymer, thermoplastic polyimide, polyethernitrile or polyphenylene sulfide, it is desirable that the film obtained with the practice of any of the above-described methods be subjected to recrystalization. In accordance with one applicable recrystalizing method, the film either once taken up or while extruded is either passed through a heating furnace or brought into contact with a heating roller, both set at a temperature several tens ° C. higher than a glass transition point Tg of the crystalline resin used, so that the film can be recrystalized.

BEST MODE FOR CARRYING OUT THE INVENTION

The present invention is below described in more detail by way of Examples and Comparative Examples.

The synthetic resins used in Examples and Comparative Examples are listed below.

PEEK (polyether ether ketone): product name 450G, product of Victrex Mfg. Ltd.

PEI (polyether imide): product name ULTEM 1000-1000, product of Japan GE Plastics Inc.

TPI (thermoplastic polyimide): product name AURUM, product of Mitsui Chemicals, Inc.

PAR (polyallylate): product name U-10, product of Unitika Ltd.

LCP (liquid crystal polymer): product name C950, product of Polyplastics Co., Ltd.

PEN (polyethernitrile): product name Idemitsu PEN; RF, product of Idemitsu Petro. Chem. Co., Ltd.

PAI (polyamide-imide): product name TORLON 4203L, product of Teijin-Amoco Engineering Plastics Inc.

PES (polyether sulfone): product name RADEL A-200A, product of Teijin-Amoco Engineering Plastics Inc.

PI (polyimide): product name U-PILEX R, product of Ube Industries, Ltd.

The platy inorganic fillers used in Examples and Comparative Examples are listed below.

(1) Synthetic mica: A synthetic mica (product name: PDM-9WA, product of Topy Industries, Ltd.) was calcined at 1,000° C. and then classified.

(2) Synthetic mica: A synthetic mica (product name: PDM-GUA, product of Topy Industries, Ltd.) was calcined at 1,000° C. and then classified.

(3) Synthetic mica: product name PDM-9WA, product of Topy Industries, Ltd.)

(4) Natural mica: product name Z-20, product of Hikawa Kogyo Co., Ltd.

(5) Natural mica: The above natural mica (4) was rendered into a 5 weight % slurry in 0.1-N $HNO_3$, stirred for 2 hours, filtered and washed with water for neutralization. The resultant was dried at 120° C. for 24 hours, pulverized and then classified.

(6) Natural mica: A natural mica (product name: FSN, product of Sanshin Koko Co., Ltd.) was calcined at 70° C. for 4 hours, rendered into a 5 weight % slurry in 0.1-N $HNO_3$, stirred for 2 hours, filtered and washed with water for neutralization. The resultant was dried at 120° C. for 24 hours, pulverized and then classified.

(7) Natural mica: product name HD-0313, product of Nichien Co., Ltd.

(8) Natural mica: product name A-11, product of Yamaguchi Mica Co., Ltd.

(9) Boehmite (1): 7.8 kg of aluminum hydroxide having an average particle diameter of 0.5 μm. 39 kg of water, 1.6 kg of calcium nitrate, 0.4 kg of sodium hydroxide and 0.12 kg of calcium hydroxide were introduced as reactants into an autoclave and then caused to react at 170° C. for 7 hours. The reaction product was washed with water, filtered, dried to obtain boehmite. This was further calcined at 600° C. to obtain γ-alumina.

The maximum diameter a (μm), thickness b (μm), aspect ratio a/b, pH of aqueous dispersion and amount of extracted alkalis (ppm) are listed in Table 1, for the platy inorganic fillers (1)-(9).

TABLE 1

|  |  | Dimension (μm) | | Aspect Ratio | Aqueous Dispersion | Amount of Extracted Alkalis (ppm) | | |
|---|---|---|---|---|---|---|---|---|
|  |  | a | b | a/b | pH | Na | K | Ca |
| (1) | Synthetic Mica | 12 | 0.5 | 24 | 6.3 | <0.1 | 1.2 | <0.1 |
| (2) | Synthetic Mica | 16 | 0.3 | 53 | 7.1 | 0.2 | 2.9 | 0.1 |
| (3) | Synthetic Mica | 30 | 0.5 | 60 | 6.3 | <0.1 | 1.2 | <0.1 |
| (4) | Natural Mica | 20 | 0.5 | 40 | 10.0 | 1.8 | 4.1 | 12 |
| (5) | Natural Mica | 20 | 0.5 | 40 | 6.7 | 0.2 | 1.7 | <0.1 |
| (6) | Natural Mica | 6.0 | 0.1 | 60 | 6.5 | 0.2 | 0.9 | <0.1 |
| (7) | Natural Mica | 64 | 0.3 | 210 | 9.6 | 1.1 | 3.1 | 4.5 |

TABLE 1-continued

|  |  | Dimension (μm) | | Aspect Ratio | Aqueous Dispersion | Amount of Extracted Alkalis (ppm) | | |
|---|---|---|---|---|---|---|---|---|
|  |  | a | b | a/b | pH | Na | K | Ca |
| (8) | Natural Mica | 18 | 0.3 | 60 | 9.7 | 2.9 | 11.5 | 3.6 |
| (9) | Boehmite | 5.0 | 0.2 | 25 | 7.2 | 2.0 | <0.1 | 7.0 |

Among the above-listed platy inorganic fillers, those designated as (1)-(3), (5), (6) and (9) fall within the specified scope of the present invention, and those designated as (4), (7) and (8) are for comparative purposes.

EXAMPLES 1-9 AND COMPARATIVE EXAMPLES 1-7

The above-listed synthetic resins and inorganic fillers in the respective proportions (parts by weight) specified in Table 2 were fed into a double-shaft kneader (product name: KTX46, product of Kobe Steel, Ltd.) to produce the resin compositions of Examples and Comparative Examples in the form of pellets. A kneading torque serving as an indication of melt stability, flexural strength and flexural modulus serving as an indication of mechanical strength, and a mold shrinkage factor serving as an indication of anisotropy were measured for the compositions obtained. The results are given in Table 3.

Each sample was charged and kneaded at 400° C. using a Labo Plastomill (product of Toyo Seiki Seisaku-sho, Ltd., chamber=30 ml). The kneading torque was measured after the lapse of 3 minutes and 20 minutes from the start of kneading. The flexural strength and flexural modulus were measured according to JIS K 7171. A molded article was produced using a 90.01×49.99×3.20 mm mold with a film gate and the mold shrinkage factor was calculated from the following equation:

Mold shrinkage factor (%)=[(dimension of the mold-dimension of the molded article)/dimension of the mold]×100

Also, thermal properties were measured according to JIS K 7191 (A method: 1.8 MPa).

TABLE 2

|  |  | Synthetic Resin | | | Platy Inorganic Filler | | |
|---|---|---|---|---|---|---|---|
|  |  |  |  |  | Synthetic Mica | Natural Mica | Natural Mica |
|  |  | PEEK | PEI | PAR | (1) | (5) | (4) |
| Ex. | 1 | 85 |  |  | 15 |  |  |
|  | 2 | 70 |  |  | 30 |  |  |
|  | 3 |  | 85 |  |  | 15 |  |
|  | 4 |  |  | 85 |  | 15 |  |
|  | 5 | 42.5 | 42.5 |  | 15 |  |  |
|  | 6 | 35 | 35 |  | 30 |  |  |
|  | 7 | 42.5 | 42.5 |  |  | 15 |  |
|  | 8 | 35 | 35 |  |  | 30 |  |
|  | 9 | 35 |  | 35 |  | 30 |  |
| Comp. Ex. | 1 | 85 |  |  |  |  | 15 |
|  | 2 | 70 |  |  |  |  | 30 |
|  | 3 |  | 85 |  |  |  | 15 |
|  | 4 |  |  | 85 |  |  | 15 |
|  | 5 | 42.5 | 42.5 |  |  |  | 15 |
|  | 6 | 35 | 35 |  |  |  | 30 |
|  | 7 | 35 |  | 35 |  |  | 30 |

TABLE 3

| | | Kneading Torque kg·m | | Flexural Strength | Flexural Modulus | Mold Shrinkage Factor % | | Thermal Property HDT |
|---|---|---|---|---|---|---|---|---|
| | | After 3 min. | After 20 min. | MPa | GPa | MD | TD | °C. |
| Ex. | 1 | 1.04 | 1.22 | 159 | 5.2 | 0.51 | 0.55 | 212 |
| | 2 | 1.07 | 1.24 | 171 | 9 | 0.42 | 0.50 | 230 |
| | 3 | 0.69 | 0.58 | 124 | 5 | 0.38 | 0.42 | 208 |
| | 4 | 1.02 | 1.22 | 130 | 5.1 | 0.37 | 0.41 | 183 |
| | 5 | 0.83 | 0.92 | 146 | 4.8 | 0.38 | 0.42 | 213 |
| | 6 | 0.87 | 0.98 | 148 | 8.2 | 0.23 | 0.27 | 222 |
| | 7 | 0.80 | 0.89 | 140 | 4.7 | 0.32 | 0.36 | 212 |
| | 8 | 0.93 | 0.91 | 145 | 8 | 0.22 | 0.26 | 220 |
| | 9 | 0.91 | 0.95 | 150 | 8.1 | 0.25 | 0.30 | 217 |
| Comp. Ex. | 1 | 0.56 | 0.82 | 132 | 3.9 | 0.72 | 0.80 | 180 |
| | 2 | 0.62 | 0.88 | 143 | 7.2 | 0.64 | 0.73 | 186 |
| | 3 | 0.43 | 0.13 | 103 | 3.7 | 0.50 | 0.54 | 172 |
| | 4 | 0.51 | 0.21 | 106 | 3.8 | 0.52 | 0.58 | 164 |
| | 5 | 0.68 | 0.47 | 120 | 3.5 | 0.51 | 0.59 | 178 |
| | 6 | 0.64 | 0.51 | 123 | 6.5 | 0.46 | 0.48 | 188 |
| | 7 | 0.71 | 0.53 | 127 | 6.5 | 0.49 | 0.56 | 178 |

As indicated in Table 3, the resin compositions of Examples in accordance with the present invention show the smaller changes in kneading torque between after 3 minutes and after 20 minutes, compared to the resin compositions of Comparative Examples, demonstrating their superior melt stability. They are also found to exhibit the superior mechanical strength, dimensional stability and heat resistance.

EXAMPLES 10-20 AND COMPARATIVE EXAMPLES 8-10

The procedure used in the above Examples was followed, except that the components were blended in the proportions (parts by weight) specified in Table 4, to prepare resin compositions. Their properties were evaluated. The results are given in Table 5. Comparative Example 10 was performed using PEEK only.

TABLE 4

| | | Synthetic Resin | | Platy Inorganic Filler | |
|---|---|---|---|---|---|
| | | Type | Amount | Type | Amount |
| Ex. | 10 | PEEK | 70 | (2) | 30 |
| | 11 | PEEK | 70 | (3) | 30 |
| | 12 | PEEK | 70 | (6) | 30 |
| | 13 | PEEK | 70 | (9) | 30 |
| | 14 | PEI | 70 | (1) | 30 |
| | 15 | TPI | 70 | (1) | 30 |
| | 16 | PAR | 70 | (1) | 30 |
| | 17 | LCP | 70 | (1) | 30 |
| | 18 | PEN | 70 | (1) | 30 |
| | 19 | PAI | 70 | (1) | 30 |
| | 20 | PES | 70 | (1) | 30 |
| Comp. Ex. | 8 | PEEK | 70 | (7) | 30 |
| | 9 | PEEK | 70 | (8) | 30 |
| | 10 | PEEK | 100 | — | 0 |

TABLE 5

| | | Kneading Torque kg·m | | Flexural Strength | Flexural Modulus | Mold Shrinkage Factor % | | Thermal Property HDT |
|---|---|---|---|---|---|---|---|---|
| | | After 3 min. | After 20 min. | MPa | GPa | MD | TD | °C. |
| Ex. | 10 | 1.09 | 1.26 | 173 | 9.2 | 0.40 | 0.48 | 230 |
| | 11 | 1.02 | 1.22 | 168 | 8.8 | 0.43 | 0.52 | 229 |
| | 12 | 1.04 | 1.24 | 175 | 9.4 | 0.38 | 0.46 | 231 |
| | 13 | 1.03 | 1.21 | 165 | 8.2 | 0.46 | 0.54 | 222 |
| | 14 | 0.64 | 0.56 | 120 | 8.1 | 0.34 | 0.36 | 210 |
| | 15 | 0.98 | 0.92 | 128 | 8.6 | 0.32 | 0.35 | 240 |

TABLE 5-continued

|  |  | Kneading Torque kg · m | | Flexural Strength MPa | Flexural Modulus GPa | Mold Shrinkage Factor % | | Thermal Property HDT °C. |
|---|---|---|---|---|---|---|---|---|
|  |  | After 3 min. | After 20 min. |  |  | MD | TD |  |
|  | 16 | 0.82 | 0.78 | 130 | 8.0 | 0.33 | 0.36 | 182 |
|  | 17 | 0.46 | 0.42 | 170 | 11.0 | 0.10 | 0.30 | 240 |
|  | 18 | 0.58 | 0.54 | 168 | 7.0 | 0.38 | 0.50 | 232 |
|  | 19 | 0.52 | 0.48 | 166 | 6.8 | 0.35 | 0.42 | 236 |
|  | 20 | 0.62 | 0.59 | 140 | 4.6 | 0.36 | 0.40 | 220 |
| Comp. Ex. | 8 | 0.60 | 0.92 | 132 | 7.0 | 0.66 | 0.75 | 182 |
|  | 9 | 0.61 | 0.90 | 134 | 7.2 | 0.64 | 0.76 | 183 |
|  | 10 | 0.98 | 1.00 | 146 | 3.7 | 1.2 | 1.7 | 150 |

As apparent from Table 5, the resin compositions of Examples in accordance with the present invention show the smaller changes in kneading torque between after 3 minutes and after 20 minutes, compared to the resin compositions of Comparative Examples, demonstrating their superior melt stability. They are also found to exhibit the superior mechanical strength, dimensional stability and heat resistance.

EXAMPLES 21-31 AND COMPARATIVE EXAMPLES 11-16

The components in the proportions (parts by weight) specified in Table 6 were blended and fed into the double-shaft kneader employed in the above Examples to obtain a pellet-form resin composition. The resulting pellet-form resin composition was extruded from a coat hanger die into a 75 μm thick film. The obtained film was then evaluated in accordance with the following procedures.

(1) Film extrudability: A melt resin drawn down from a T-die was taken up and indicated by ○ if it was processed successfully into a film, by Δ if it was successfully taken up but had a poor appearance or produced many bubbles and by x if it failed to be taken up.

(2) Toughness (flexibility):

Each film was bent at an angle of 180 degrees and observed if brittle fracture was caused to occur. The film was indicated by x if it broke like a glass or a part or whole of its bent portion fractured and by ○ if no breakage or fracture was observed.

(3) Curl behavior of Cu-laminated film: Each film was pressed to a 35 μm thick electrolytic Cu foil under a pressure of 10 kg/cm² at 210° C. for 30 minutes to achieve press-bonding thereof. The curl behavior of the resulting Cu-laminated film was measured and indicated by ○ if its radius of curvature was over 200 mm, by Δ if within the range of 100-200 mm and by x if below 100 mm.

(4) Tensile strength: The tensile strength was measured by performing a tensile test at a pulling rate of 300 mm/min according to JIS K 7311.

(5) Linear expansion coefficient: An SSC5200H Disk Station, TMA120 thermomechanical analyzer, manufactured by Seiko Instruments Inc., was utilized to measure the linear expansion coefficient in the 20-130° C. temperature range. MD indicates a direction along which the film was taken up and TD indicates a direction transverse thereto.

(6) TMA elongation: A 5×25 mm strip test specimen was placed under a tension load of 50 g and its elongation (%) was measured at a temperature increase of 5° C./min within the range of 20-250° C. using the TMA120 thermomechanical analyzer.

(7) Resistance to soldering temperature: Each film was immersed in a 260° C. bath of molten solder for 10 seconds and observed for deformation. The film was indicated by x if it deformed largely, by Δ if deformed moderately and by ○ if little deformed.

The results are shown in Table 7.

TABLE 6

|  |  | Synthetic Resin | | Synthetic Mica | | | Natural Mica | | |
|---|---|---|---|---|---|---|---|---|---|
|  |  | Type | Amount | (1) | (2) | (3) | (4) | (7) | (8) |
| Ex. | 21 | PEEK | 70 | 30 |  |  |  |  |  |
|  | 22 | PEI | 70 | 30 |  |  |  |  |  |
|  | 23 | PEEK/PEI | 85 | 15 |  |  |  |  |  |
|  | 24 | PEEK/PEI | 70 | 30 |  |  |  |  |  |
|  | 25 | PEEK/PEI | 70 |  | 30 |  |  |  |  |
|  | 26 | TPI | 70 | 30 |  |  |  |  |  |
|  | 27 | PAR | 70 | 30 |  |  |  |  |  |
|  | 28 | LCP | 70 | 30 |  |  |  |  |  |
|  | 29 | PEN | 70 | 30 |  |  |  |  |  |
|  | 30 | PAI | 70 | 30 |  |  |  |  |  |
|  | 31 | PES | 70 | 30 |  |  |  |  |  |
| Comp. Ex. | 11 | PEEK | 70 |  |  | 30 |  |  |  |
|  | 12 | PEEK | 70 |  |  |  | 30 |  |  |
|  | 13 | PEEK/PEI | 70 |  |  |  |  | 30 |  |
|  | 14 | PEEK/PEI | 70 |  |  |  |  |  | 30 |
|  | 15 | PI | 100 |  |  |  |  |  |  |
|  | 16 | PEEK | 100 |  |  |  |  |  |  |

TABLE 7

|  |  | Processability Film Extrudability | Toughness (Flexibility) | Curl Behavior of Cu-Laminated Film | Tensile Strength kg/mm² | Linear Expansion Coefficient ×10⁻⁵/K MD | Linear Expansion Coefficient ×10⁻⁵/K TD | TMA Elongation % | Resistance to Soldering Temp. |
|---|---|---|---|---|---|---|---|---|---|
| Ex. | 21 | ⊚ | ○ | ○ | 21.1 | 1.8 | 2.4 | 1.0 | ○ |
|  | 22 | ○ | ○ | ○ | 20.2 | 1.9 | 2.5 | 1.8 | ○ |
|  | 23 | ⊚ | ○ | Δ | 19.8 | 2.3 | 2.8 | 1.6 | ○ |
|  | 24 | ⊚ | ○ | ○ | 20.3 | 2.0 | 2.3 | 1.4 | ○ |
|  | 25 | ⊚ | ○ | ○ | 20.9 | 1.9 | 2.1 | 1.2 | ○ |
|  | 26 | ○ | ○ | ○ | 21.4 | 2.2 | 2.3 | 1.7 | ○ |
|  | 27 | ○ | ○ | ○ | 21.2 | 2.4 | 2.5 | 2.0 | ○ |
|  | 28 | ○ | ○ | ○ | 21.8 | 2.6 | 2.7 | 2.2 | ○ |
|  | 29 | ○ | ○ | ○ | 21.0 | 2.3 | 2.5 | 1.9 | ○ |
|  | 30 | ○ | ○ | ○ | 21.3 | 2.5 | 2.7 | 2.3 | ○ |
|  | 31 | ○ | ○ | ○ | 21.2 | 2.2 | 2.3 | 1.8 | ○ |
| Comp. Ex. | 11 | ○ | Δ | x | 6.2 | 4.7 | 5.2 | 3.8 | Δ |
|  | 12 | Δ | x | x | 4.2 | 4.9 | 5.3 | 4.6 | x |
|  | 13 | x | x | x | 3.8 | 5.4 | 5.7 | 7.2 | x |
|  | 14 | x | x | x | 3.9 | 5.3 | 6.2 | 8.2 | x |
|  | 15 | — | ○ | ○ | 30.0 | 1.3 | 1.5 | 0.4 | ○ |
|  | 16 | ⊚ | ○ | x | 10.0 | 4.8 | 5.0 | 6.2 | Δ |

As can be clearly seen from the results shown in Table 7, the resin compositions of Examples in accordance with the present invention are well processable into films. Also, the films obtained via processing of these compositions exhibit the superior mechanical strength, heat resistance and the like. Further, when they are laminated with a copper foil, curling is maintained at a low degree of occurrence.

EXAMPLES 32-45

The procedure used in the above Examples was followed, except that the components were blended in the proportions (parts by weight) specified in Table 8, to prepare resin compositions in accordance with the present invention and produce 75 μm thick films therefrom. Their properties were subsequently evaluated in the same manner as in the above Examples. The results are shown in Table 9. In Table 9, the evaluation results obtained for PI only and PEEK only are also shown.

TABLE 8

|  | Synthetic Resin | | Platy Inorganic Filler | |
|---|---|---|---|---|
| Ex. | Type | Amount | Type | Amount |
| 32 | PEEK | 70 | (6) | 30 |
| 33 | PEI | 70 | (6) | 30 |
| 34 | PEEK/PEI | 85 | (6) | 15 |
| 35 | PEEK/PEI | 70 | (6) | 30 |
| 36 | PEEK/PEI | 70 | (6) | 30 |
| 37 | TPI | 70 | (6) | 30 |
| 38 | PAR | 70 | (6) | 30 |
| 39 | LCP | 70 | (6) | 30 |
| 40 | PEN | 70 | (6) | 30 |
| 41 | PAI | 70 | (6) | 30 |
| 42 | PES | 70 | (6) | 30 |
| 43 | PEEK | 70 | (9) | 30 |
| 44 | PET | 70 | (9) | 30 |
| 45 | PEEK/PEI | 70 | (9) | 30 |

TABLE 9

|  |  | Processability Film Extrudability | Toughness (Flexibility) | Curl Behavior of Cu-Laminated Film | Tensile Strength kg/mm² | Linear Expansion Coefficient ×10⁻⁵/K MD | Linear Expansion Coefficient ×10⁻⁵/K TD | TMA Elongation % | Resistance to Soldering Temp. |
|---|---|---|---|---|---|---|---|---|---|
| Ex. | 32 | ⊚ | ○ | ○ | 22.5 | 1.5 | 2.0 | 0.9 | ○ |
|  | 33 | ⊚ | ○ | ○ | 21.6 | 1.6 | 2.1 | 1.7 | ○ |
|  | 34 | ⊚ | ○ | ○ | 21.1 | 1.9 | 2.3 | 1.4 | ○ |
|  | 35 | ⊚ | ○ | ○ | 21.7 | 1.6 | 1.9 | 1.2 | ○ |
|  | 36 | ⊚ | ○ | ○ | 22.9 | 1.8 | 1.9 | 1.0 | ○ |
|  | 37 | ⊚ | ○ | ○ | 22.6 | 2.0 | 2.1 | 1.5 | ○ |
|  | 38 | ⊚ | ○ | ○ | 23.3 | 2.1 | 2.2 | 1.8 | ○ |
|  | 39 | ⊚ | ○ | ○ | 22.4 | 1.9 | 2.1 | 2.0 | ○ |
|  | 40 | ⊚ | ○ | ○ | 22.7 | 2.1 | 2.2 | 1.7 | ○ |

TABLE 9-continued

| | | | Curl Behavior of Cu-Laminated Film | | Linear Expansion Coefficient $\times 10^{-5}$/K | | TMA Elongation | Resistance to Soldering Temp. |
|---|---|---|---|---|---|---|---|---|
| | Processability Film Extrudability | Toughness (Flexibility) | | Tensile Strength kg/mm² | MD | TD | % | |
| 41 | ◎ | ○ | ○ | 21.9 | 1.9 | 2.1 | 2.1 | ○ |
| 42 | ◎ | ○ | ○ | 22.2 | 2.0 | 2.1 | 1.6 | ○ |
| 43 | ◎ | ○ | ○ | 24.2 | 1.7 | 2.2 | 1.1 | ○ |
| 44 | ◎ | ○ | ○ | 23.3 | 1.8 | 2.3 | 1.9 | ○ |
| 45 | ◎ | ○ | ○ | 22.8 | 2.1 | 2.5 | 1.6 | ○ |
| PI | — | ○ | ○ | 30.0 | 1.3 | 1.5 | 0.4 | ○ |
| PEEK | ◎ | ○ | × | 10.0 | 4.8 | 5.0 | 6.2 | Δ |

As can be clearly seen from the results shown in Table 9, the resin compositions of Examples in accordance with the present invention are-well processable into films. Also, the films obtained via processing of these compositions exhibit the superior mechanical strength, heat resistance and the like. Further, when they are laminated with a copper foil, curling is maintained at a low degree of occurrence.

Also, the above-fabricated laminate films with a copper foil were used to produce flexible printed circuit boards. These boards were found to insure high circuit reliability.

UTILITY IN INDUSTRY

The resin compositions in accordance with the present invention are excellent in mechanical strength and heat resistance, low in linear expansion coefficient and anisotropy, and little susceptible to deterioration. Accordingly, they are applicable for vaious uses such as automobile parts, mechanical parts, electrical-electrnonic parts and the like, and particularly suitable for use as a heat-resistant film for a flexible printed circuit board.

The invention claimed is:

1. A flexible circuit board incorporating a heat-resistant film formed from a thermoplastic resin composition comprising:
   (A) a thermoplastic resin having a melting temperature of 300° C. or above, and
   (B) a platy inorganic filler incorporated in the thermoplastic resin and having the following properties:
   pH of aqueous dispersion: which is determined by metering a 1 g sample into a 100 ml beaker, introducing 100 ml of deionized water into the beaker, stirring the beaker content by a magnetic stirrer for 10 minutes, and then measuring its pH by a nH meter: 5.5-8.0,
   amount of extracted alkalis: which is determined by dispersing a 1 g sample in 100 ml water and stirring the resulting aqueous dispersion at room temperature for 1 hour and filtering it through a No. 5 filter gaper to obtain a filtrate which subsequently is measured by atomic absorption spectrometry: Na 30 ppm or below and K 40 ppm or below,
   maximum diameter a: 50 μm or below,
   thickness b: 1.0 μm or below, and
   aspect ratio (a/b): 20 or above
   wherein said platy inorganic filler is incorporated in said thermoplastic resin, and said resin composition has thermal plasticity.

2. The flexible circuit board of claim 1, wherein said platy inorganic filler is a flaky mica.

3. The flexible circuit board of claim 1, wherein said amount of extracted alkalis further includes Ca: 10 ppm or below.

4. The flexible circuit board of claim 1, wherein said thermoplastic resin having a melting temperature of 300° C. or above comprises one or more substances selected from the group consisting of polyallyl ether ketone, polyetherimide, thermoplastic polyimide, polyallylate, aromatic polysulfone and liquid crystal polymer.

5. The flexible circuit board of claim 1, wherein said resin composition is a resin composition useful for formation into a heat-resistant film for a flexible printed circuit board.

6. A flexible circuit board incorporating a heat-resistant film formed from a thermoplastic resin composition comprising:
   (A) a synthetic resin having a melting temperature of 300° C. or above, and
   (B) a flaky inorganic filler incorporated in the resin and having a pH of aqueous dispersion in the range of 5.5-8.0, and an amount of extracted alkalis: Na=30 ppm or below and K=40 ppm or below.

7. The flexible circuit board of claim 6, wherein said flaky inorganic filler comprises one or more of substances selected from the group consisting of flaky titanate compounds, mica, sericite, illite, talc, kaolinite, montmorillonite, boehmite, γ-alumina and α-alumina.

8. The flexible circuit board of claim 6, wherein said flaky inorganic filler is an inorganic filler treated with an inorganic or organic acid to remove the extractable alkalis and/or heat treated at 600-1,300° C.

9. The flexible circuit board of claim 6, wherein said synthetic resin having a melting temperature of 300° C. or above comprises one or more substances selected from the group consisting of polyallyl ether ketone, polyetherimide, thermoplastic polyimide, polyallylate, aromatic polysulfone and liquid crystal polymer.

10. The flexible circuit board of claim 6, wherein said resin composition is a resin composition useful for formation into a heat-resistant film for a flexible printed circuit board.

11. A flexible circuit board incorporating a heat-resistant film formed from a thermoplastic resin composition comprising:
   (A) a thermoplastic resin having a melting temperature of 300° C. or above, and (B) a synthetic mica incorporated in the resin and having a maximum diameter a of 20 µm or below, a thickness b of 0.05-1.0 µm and an aspect ratio of 20 or above wherein said thermoplastic resin composition has thermal plasticity.

12. The flexible circuit board of claim 11, wherein said thermoplastic resin having a melting temperature of 300° C. or above comprises one or more substances selected from the group consisting of polyallyl ether ketone, polyetherimide, thermoplastic polyimide, polyallylate, aromatic polysulfone and liquid crystal polymer.

13. The flexible circuit board of claim 11, wherein said thermoplastic resin composition is a thermoplastic resin composition useful for formation into a heat-resistant film for a flexible printed circuit board.

* * * * *